United States Patent
Hoefer et al.

(10) Patent No.: US 9,222,955 B2
(45) Date of Patent: Dec. 29, 2015

(54) DAMPING DEVICE FOR A MICROMECHANICAL SENSOR DEVICE

(71) Applicants: Holger Hoefer, Sonnenbuehl (DE); Ricardo Ehrenpfordt, Korntal-Muenchingen (DE); Klaus Offterdinger, Stuttgart (DE); Christian Solf, Karlsruhe (DE)

(72) Inventors: Holger Hoefer, Sonnenbuehl (DE); Ricardo Ehrenpfordt, Korntal-Muenchingen (DE); Klaus Offterdinger, Stuttgart (DE); Christian Solf, Karlsruhe (DE)

(73) Assignee: ROBERT BOSCH GMBH, Stuttgart (DE)

(*) Notice: Subject to any disclaimer, the term of this patent is extended or adjusted under 35 U.S.C. 154(b) by 418 days.

(21) Appl. No.: 13/757,082

(22) Filed: Feb. 1, 2013

(65) Prior Publication Data

US 2013/0199295 A1 Aug. 8, 2013

(30) Foreign Application Priority Data

Feb. 2, 2012 (DE) .......................... 10 2012 201 486

(51) Int. Cl.
*G01P 1/00* (2006.01)
*H05K 3/00* (2006.01)
*G01P 15/08* (2006.01)
*H05K 1/14* (2006.01)
*H05K 1/02* (2006.01)

(52) U.S. Cl.
CPC ............. *G01P 1/003* (2013.01); *G01P 15/0802* (2013.01); *H05K 1/141* (2013.01); *H05K 3/00* (2013.01); *G01P 2015/0882* (2013.01); *H05K 1/0271* (2013.01); *H05K 2201/049* (2013.01); *H05K 2201/10151* (2013.01); *Y10T 29/4913* (2015.01)

(58) Field of Classification Search
CPC ................ G01P 1/003; G01P 15/0802; G01P 2015/0805; G01P 2015/0877; G01P 2015/0882

See application file for complete search history.

(56) References Cited

U.S. PATENT DOCUMENTS

| | | | |
|---|---|---|---|
| 4,882,933 A | 11/1989 | Petersen et al. | |
| 7,038,150 B1* | 5/2006 | Polosky et al. | 200/61.45 R |
| 2006/0097404 A1 | 5/2006 | Cho et al. | |
| 2006/0197173 A1* | 9/2006 | Mase | 257/458 |
| 2009/0194860 A1* | 8/2009 | Holzmann et al. | 257/678 |
| 2012/0038963 A1* | 2/2012 | Takubo et al. | 359/224.1 |

FOREIGN PATENT DOCUMENTS

| | | |
|---|---|---|
| DE | 10 2006 026 878 | 12/2007 |
| JP | 8-255826 | 10/1996 |
| JP | 10-296435 | 11/1998 |

* cited by examiner

*Primary Examiner* — Paul West
(74) *Attorney, Agent, or Firm* — Kenyon & Kenyon LLP

(57) ABSTRACT

A damping device for a micromechanical sensor device, having at least one first intermediate layer having at least two sections, a second section being situated around a first section, a lateral distance being provided between the first and the second section, and an elastic device being provided between the first section and the second section as an integral part of the first intermediate layer.

16 Claims, 10 Drawing Sheets

Fig. 18

DAMPING DEVICE FOR A MICROMECHANICAL SENSOR DEVICE

CROSS REFERENCE

The present application claims the benefit under 35 U.S.C. §119 of German Patent Application No. DE 102012201486.1 filed on Feb. 2, 2012, which is expressly incorporated herein by reference in its entirety.

FIELD

The present invention relates to a damping device for a micromechanical sensor device.

BACKGROUND INFORMATION

In the packaging of micromechanical sensors, it is sometimes absolutely necessary to keep interfering vibrations away from the sensitive sensor element. The micromechanical sensors (for example, inertial sensors such as yaw rate sensors and acceleration sensors) are exposed to different stresses at an intended installation site in a motor vehicle as the result of various influences. One particular influence is vibration stress which occurs, among other elements, in high-resolution inertial sensors for ESP applications in a control unit. To protect or to decouple the sensors from these vibrations, specialized damping structures and materials must be provided inside the sensor housing. In the past, external and internal dampers as described in German Patent Application No. DE 10 2006 026 878 A1, for example, have been used for this purpose. For sensors in inexpensive molded housings, in particular for use in the engine compartment of a motor vehicle, there are still no satisfactory, cost-effective approaches. In particular in recent LGA/BGA housings, an effective decoupling of the printed circuit board and the sensor is very important, since the housing has no connecting wires, which for small-outline integrated circuit (SOIC) housings, for example, provide a certain vibration decoupling.

SUMMARY

An object of the present invention, therefore, is to provide an improved damping device for micromechanical sensors.

The object may be achieved by an example damping device for a micromechanical sensor device, including at least one first intermediate layer having at least two sections, a second section being situated around a first section, a lateral distance being provided between the first section and the second section, and an elastic device being provided between the first section and the second section as an integral part of the first intermediate layer. The damping device according to the present invention thus provides an oscillatable elastic system which may effectively protect a micromechanical sensor device supported thereon from harmful vibrations, and thus, from undesirable damage.

One preferred specific embodiment of the damping device according to the present invention is characterized in that contacting elements of the first intermediate layer are situated on a bottom side of the second section or on a bottom side of the first section. In this way, a position of a mechanically active mass of the first intermediate layer may be determined, depending on the selection by the user.

One preferred specific embodiment of the damping device according to the present invention is characterized in that the first intermediate layer has a printed circuit board material. A metallic layer of the printed circuit board material for electrical connections between oppositely situated surfaces of the intermediate layer may thus be advantageously provided.

One preferred specific embodiment of the damping device is characterized in that the contacting elements are electrically conductive, with the aid of the contacting elements, electrical contact surfaces on a top side of the first intermediate layer being connected via the elastic device to electrical contact surfaces on the bottom side of the first intermediate layer in an electrically conductive manner. The first intermediate layer thus additionally assumes an electrical contacting function, as the result of which electrical connecting contacts of the micromechanical sensor device are guided to a printed circuit board on which the micromechanical sensor device is electrically contacted.

One preferred specific embodiment of the damping device according to the present invention provides that the elastic device has at least three generally uniformly arranged elastic elements between the first section and the second section. One advantage of this specific embodiment is that damping and oscillation properties of the damping device are particularly uniform, an oscillation of the first intermediate layer in all three spatial directions being assisted.

One preferred specific embodiment of the damping device according to the present invention is characterized in that the elastic elements have generally identical spring constants. Harmonization of the oscillation behavior of the damping device according to the present invention may thus be even further increased.

One preferred specific embodiment of the damping device according to the present invention provides that an area around the elastic device has an elastic damping material, at least in places. Resonance sharpness of the overall oscillatable system in a resonance frequency range may thus be advantageously reduced.

One preferred specific embodiment of the device according to the present invention is characterized in that the damping material has at least one or multiple materials from the following group: silicone elastomer, silicone gel, gel containing fillers, foam-like material. A selection or a combination of elastic damping materials may thus be adapted to damping requirements in a targeted manner.

One preferred refinement of the example device according to the present invention provides that the elastic damping material is situated, at least in part, on a top side of the second section of the first intermediate layer, or is situated, at least in part, on a top side of the first section of the first intermediate layer. In this way, a transition area between the non-oscillatable portion of the first intermediate layer of the damping device according to the present invention may be inhibited at a coupling of a resonance sharpness on the housed micromechanical sensor device.

One advantageous refinement of the example damping device according to the present invention provides that a second intermediate layer is provided with a printed circuit board material which is connected to the first intermediate layer in an electrically conductive manner, the second intermediate layer mapping an electrical contacting pattern of the top side of the first intermediate layer onto a bottom side of the second intermediate layer. In this way, an electrical contacting grid or pattern of the housed micromechanical sensor device may be transferred in an unaffected manner from the interconnected damping device to a printed circuit board on which the sensor device is to be contacted.

One advantageous refinement of the example damping device according to the present invention provides that the damping device has a cover device for covering the damping device together with the micromechanical sensor device. With the aid of the additional cover device, the damping device may be effectively protected from soiling or from harmful EMC influences.

One advantageous refinement of the damping device according to the present invention provides that the elastic elements are metallic. By use of metal for the elastic elements, a material which is well-defined from a mechanical standpoint is available, which due to its well-reproducible properties may be adapted very well to the damping requirements of the damping device.

One advantageous refinement of the damping device according to the present invention is characterized in that the micromechanical sensor device is attachable beneath the first section of the first intermediate layer, the second intermediate layer connecting electrical contact surfaces of the first section to electrical contact surfaces on a bottom side of the second intermediate layer in an electrically conductive manner, a physical mass being provided on a top side of the first section for balancing the damping device together with the micromechanical sensor device. This results in a type of balanced, housed overall system in which the micromechanical sensor device is protected from environmental influences and supported in a balanced, "hanging" manner, in a manner of speaking.

One preferred refinement of the damping device provides that a physical mass is situated on a bottom side of the first section of the first intermediate layer, the physical mass being designed in such a way that the center of gravity of the damping device together with the sensor device is situated generally centrally in the first intermediate layer. This results in a balanced design of the damping device for avoiding tilting modes by introducing an additional mass (in the form of a metal, for example) on the bottom side of the first section of the first intermediate layer. For a mechanical excitation of the damping device in a certain direction, an oscillation response of the damping device may thus be advantageously forced in the same direction.

Another preferred specific embodiment of the damping device according to the present invention provides that the physical mass is designed as a metal layer, the metal layer being connected to the first intermediate layer with generally secure contact. In this way, the design of the additional physical mass is advantageously geometrically shifted into the plane of the first intermediate layer, thus contributing to a space-saving design of the damping device, and additional intermediate layers for wiring purposes may be dispensed with. Balanced damper systems having a small installation height may thus be implemented with only slight additional costs.

One preferred refinement of the damping device according to the present invention is characterized in that the physical mass is situated, at least partially, beneath the first intermediate layer. This results in a space-saving design of the damping device according to the present invention, which may be well-balanced by a dimensioning of the metal layer.

Preferred specific embodiments of the damping device according to the present invention provide that the physical mass is situated predominantly or generally exclusively beneath the second section of the first intermediate layer. Due to the space which is thus freed up beneath the first section of the first intermediate layer, additional electronic circuit components may be advantageously placed on the first intermediate layer.

One preferred specific embodiment of the damping device according to the present invention provides that a bottom side of the first section of the first intermediate layer is electrically contactable with a printed circuit board. The mechanical mass in the externally situated second section of the first intermediate layer thus becomes mechanically effective. This advantageously results in a reduced lateral dimensioning of the overall damping device, which contributes to a space-saving overall system.

In preferred specific embodiments of the damping device according to the present invention, a further large-mass printed circuit board layer is situated beneath the first section or beneath the first section and the second section of the first intermediate layer, a bottom side of the first intermediate layer being electrically contactable with the printed circuit board. This corresponds to the previously mentioned specific embodiment, except that now, instead of a metallic additional mass, an additional mass in the form of a conventional printed circuit board layer is provided. An electrical through-contacting of electrical printed conductors is thus advantageously greatly simplified due to technological reasons.

One advantageous refinement of the damping device according to the present invention provides that the damping device has a second intermediate layer which is connected to a top side of the second section of the first intermediate layer in an electrically conductive manner, the second intermediate layer connecting electrical contact surfaces to contact surfaces on a bottom side of the first section of the first intermediate layer in an electrically conductive manner. The mentioned specific embodiment is primarily characterized in that a pin-compatible design of contacts of the micromechanical sensor device may be achieved. A damped or an undamped variant of the micromechanical sensor device may thus be resorted to, depending on the selection by the user.

In one advantageous refinement of the example damping device according to the present invention, the printed circuit board material of the first intermediate layer has a cavity, electrical contact surfaces on a top side of the first intermediate layer being connected to contact surfaces on a bottom side of the first section of the first intermediate layer. The need for an additional intermediate layer for rewiring purposes is thus advantageously dispensed with. Due to the cavity within the first intermediate layer, a conventional connecting method may be carried out with the aid of a known printed circuit technology for a lead-through of electrical printed conductors. In addition, an additional soldering step of soldering the second intermediate layer to the first intermediate layer is thus advantageously dispensed with.

In one advantageous refinement of the example damping device according to the present invention, the center of gravity of the damping device together with the sensor device is centrally situated, moments of inertia of the sensor device, of the first intermediate layer, and of the physical mass cancelling each other out. This results in a well-balanced overall system which is largely insensitive to harmful vibration and oscillation influences.

One advantageous refinement of the damping device according to the present invention provides that a damping range of the damping device is in a frequency range between approximately 5 kHz and approximately 30 kHz. As a result of this selection, a typical excitation frequency range of known yaw rate sensors may be effectively damped.

In one preferred specific embodiment of the damping device according to the present invention, a self-resonant frequency of the damping device, together with the micromechanical sensor device, is appropriately below a frequency to be damped. An influence of a self-resonance on the damping device may thus be effectively minimized.

The present invention is described in greater detail below together with further features and advantages, with reference to several figures. All described or illustrated features, alone or in any given combination, constitute the subject matter of the present invention, independently of their wording or illustration in the description or the figures, respectively. It is understood as a matter of course that the figures are intended solely to illustrate the general principles according to the present invention, and therefore, no proportions or dimensions may be inferred from the figures.

DETAILED DESCRIPTION OF EXAMPLE EMBODIMENTS

Figure 1:
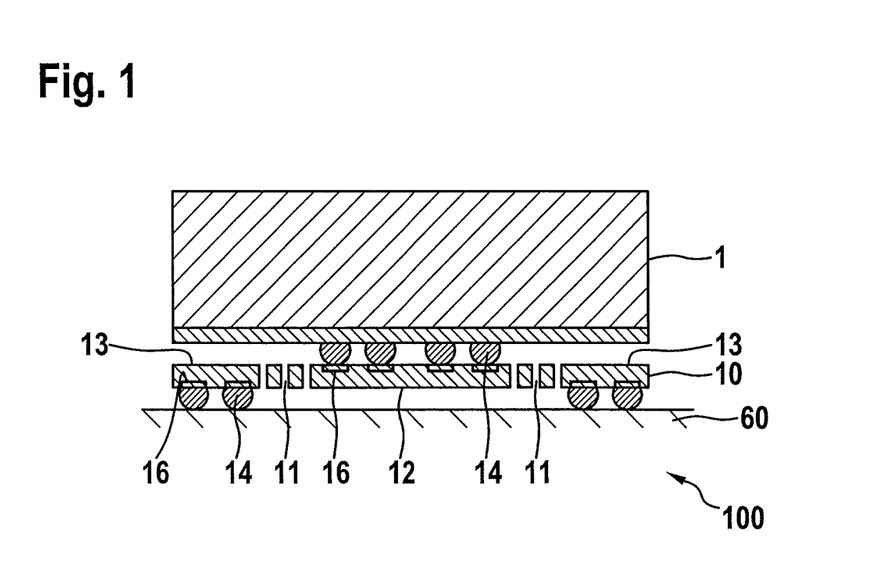
FIG. 1 shows a first specific embodiment of the damping device according to the present invention.

FIG. 1 shows a sectional view of one specific embodiment of damping device 100 according to the present invention. Damping device 100 has a first intermediate layer 10, having a printed circuit board material, which is subdivided by an elastic device 11 into a centrally situated first section 12 and a second section 13 which surrounds first section 12 in a ring-like manner. A lateral distance is thus formed between the two mentioned sections 12, 13, i.e., the two substrate parts.

Contacting elements 14 are situated on a bottom side of second section 13 of first intermediate layer 10. However, contacting elements 14 may also optionally be situated on a surface of a printed circuit board 60 on which the arrangement composed of sensor device 1 and damping device 100 is mounted. Contacting elements 14 are also situated on a printed circuit board substrate on which sensor device 1 is mounted, and therefore, also on a top side of first section 12 of first intermediate layer 10.

Contacting elements 14 are preferably designed as solder balls, solder bumps, or solder depots, a typical diameter of an individual contacting element 14 being approximately 300 μm, for example, depending on the distance dimension between the contacting elements. Contacting elements 14 also function as spacer elements which provide a distance between printed circuit board 60 and first intermediate layer 10 or between first intermediate layer 10 and the printed circuit board substrate of sensor device 1. Thus, it is apparent that the maximum possible mechanical deflection, and thus, an extent of oscillation capability of first intermediate layer 10, may be dimensioned by selecting a geometric dimension of contacting elements 14. An oscillatable structure of first intermediate layer 10 is formed in this way. In particular, micromechanical sensor device 1 (housed with the aid of a BGA or LGA housing, for example), in the form of an MEMS sensor, for example, which is rigidly fastened on a top side of first section 12 of first intermediate layer 10, is thus oscillatably supported.

With the aid of elastic device 11, an oscillatably supported overall system is thus formed which is able to largely damp harmful vibration and oscillation influences on sensor device 1. Electrically conductive contact surfaces 16 are situated on a top side of first section 12 and on a bottom side of second section 13, and are connected to one another in an electrically conductive manner. For this purpose, first intermediate layer 10 has a printed circuit board material, the connections being guided via elastic device 11. Alternatively, it is also possible for electrical connections from sensor device 1 to be separately guided from sensor device 1 to printed circuit board 60 with the aid of a flexible printed circuit board (not illustrated), without using first intermediate layer 10 as an electrical contacting means. In this case, first intermediate layer 10 has a purely mechanical functionality.

Figure 2:
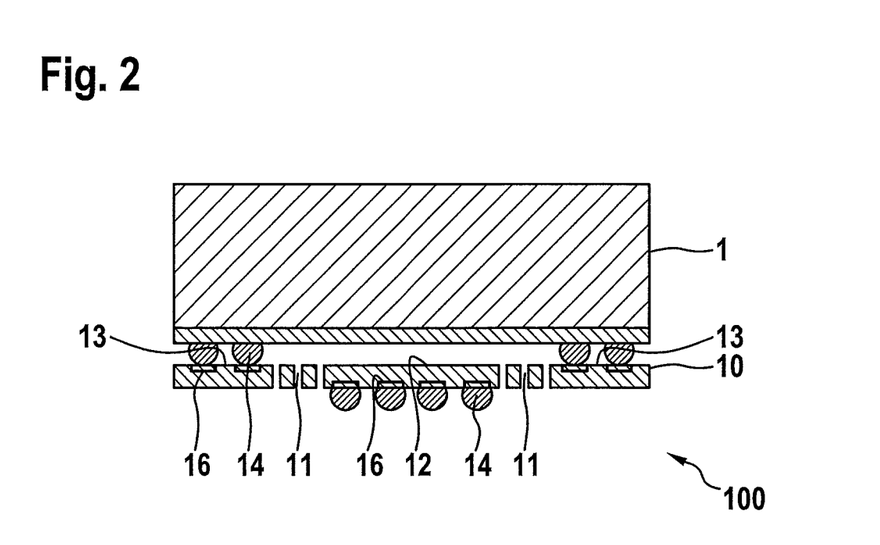
FIG. 2 shows another specific embodiment of the damping device according to the present invention.

FIG. 2 shows a modified variant of damping device 100 according to the present invention, generally externally situated second section 13 of first intermediate layer 10 now being oscillatable due to the fact that the middle area is now contacted with printed circuit board 60 (not illustrated in FIG. 2) via contacting elements 14. In the specific embodiment in FIG. 2 it is also possible at the same time for contacting elements 14 to assume an electrical contacting function in the manner described above. Vibrations which via printed circuit board 60 are coupled to first intermediate layer 10 at an installation site of the sensors (for example, on a hydraulic unit in the engine area of a motor vehicle) may thus be decoupled from actual sensor housing 1 via the spring structures of elastic device 11.

Figure 3:
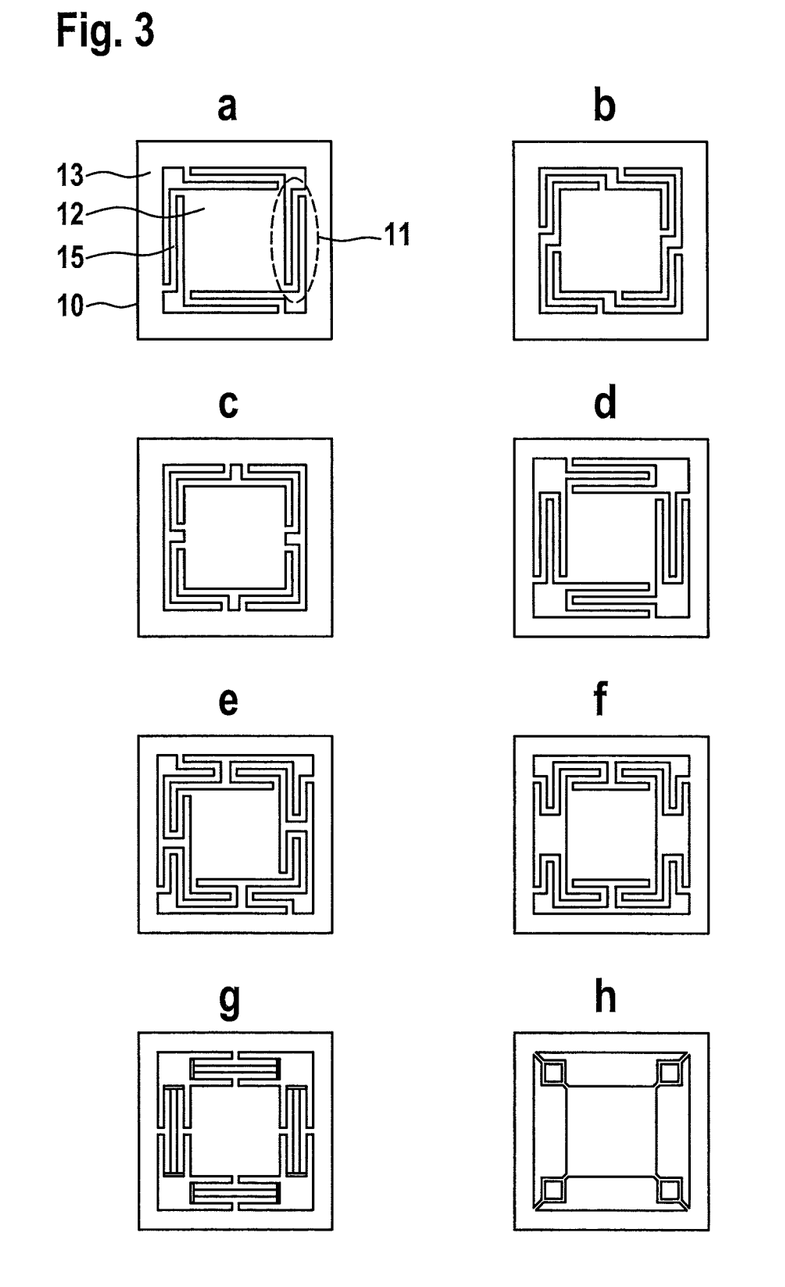
FIG. 3 shows multiple specific embodiments of first intermediate layers of the damping device according to the present invention.

FIG. 3 shows multiple possible designs of first intermediate layer 10 of damping device 100 according to the present invention. In various variations a through h, a total of eight different forms of first intermediate layer 10 are illustrated in principle. An essentially uniform lateral distance is apparent in each case between first section 12 and second section 13 of first intermediate layer 10, elastic device 11 connecting the two sections 12, 13 to one another. Movability of first section 12 of first intermediate layer 10 in all three spatial directions is assisted due to the specific design of elastic device 11. The three variants a, b, and c are characterized in that only one elastic element or spring bar 15 is situated in the area between the first and second sections, thus contributing on the one hand to a space-saving design of first intermediate layer 10, and on the other hand to a particularly good oscillation capability in all three spatial directions. In contrast, elastic devices 11 in variants d through h have multiple meandering elastic elements 15, as the result of which elasticity and robustness of elastic device 11 may be advantageously increased. Elastic elements 15 may preferably all have approximately identical spring constants.

Figure 4:
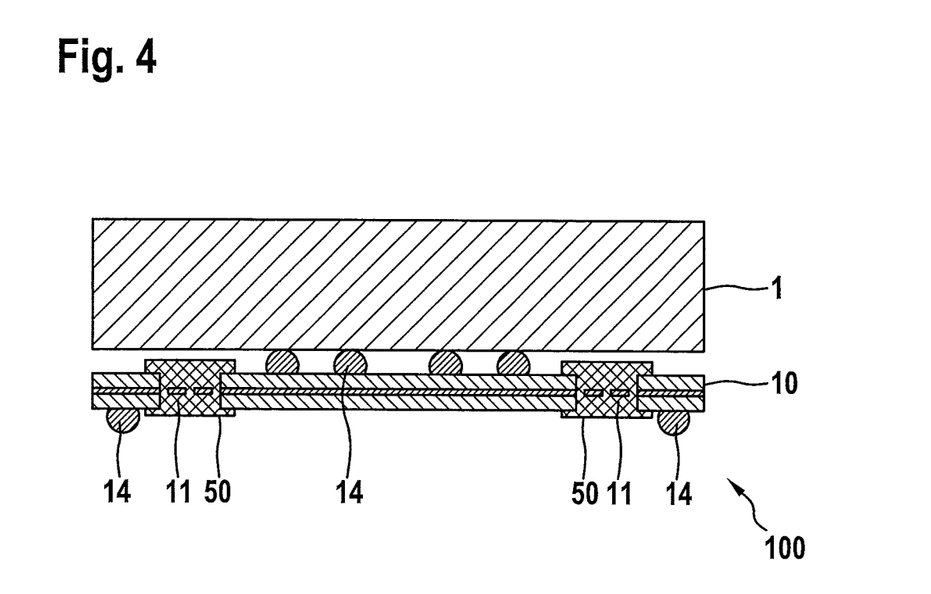
FIG. 4 shows another specific embodiment of the damping device according to the present invention.

FIG. 4 shows another specific embodiment of damping device 100 according to the present invention. In particular, in this specific embodiment elastic damping materials 50 are provided in the area of elastic device 11 of first intermediate layer 10. Resonance behavior of damping device 100 may thus be improved in that resonance sharpness, which also involves elastic device 11, is damped with the aid of elastic damping material 50. Elastic element 15 of elastic device 11 may preferably be designed as a metallic spring (made of copper, for example), so that use is advantageously made of a well-known, defined material property (modulus of elasticity, for example) via which physical oscillation properties of damping device 100 may be dimensioned particularly well. The Cu spring of elastic device 11 may be easily produced by removing printed circuit board material from the top and bottom of elastic element 15.

Elastic damping material 50 may preferably be an elastomer, for example a silicone elastomer, or a silicone gel, a gel containing fillers, for example sand-like fillers or foam-like materials. The function of elastic damping material 50 is primarily to optimize the quality of the spring-mass system of damping device 100, so that resonance sharpness, which is actually undesirable, occurring in principle due to the design, is damped by the use of elastic damping material 50. In addition to the damping function, elastic damping material 50 also acts as an additional spring.

An intrinsic damper mode may be set via material properties (Shore hardness, intrinsic damping, for example) and a geometry of elastic damping material 50. The system illustrated in FIG. 4 may be particularly advantageous, since prior to the contacting and soldering, damping material 50 may be applied in a separate process step, for example by extrusion, injection molding, transfer molding, printing, or dispensing. This greatly simplifies the process chain and the production method of first intermediate layer 10. In addition, after the soldering, a damping material 50, which, due to the height of contacting element 14, extends into the free area between first intermediate layer 10 and the sensor housing, or between first intermediate layer 10 and the substrate material of printed circuit board 60, may advantageously function as particle protection. An electrically conductive plane which is part of the printed circuit board material of first intermediate layer 10 is indicated within first intermediate layer 10.

Figure 5:
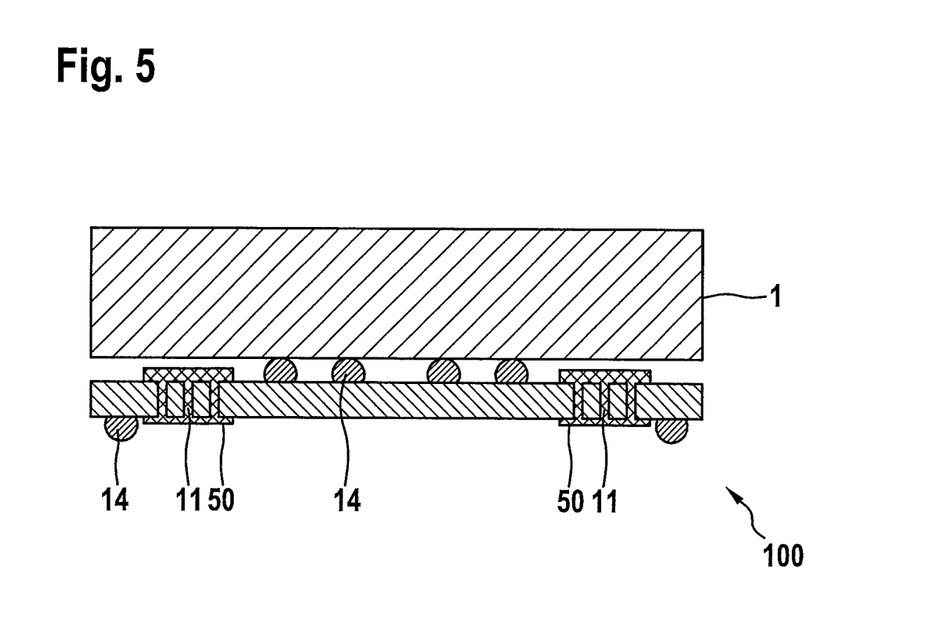
FIG. 5 shows another specific embodiment of the damping device according to the present invention.

FIG. 5 shows another specific embodiment of damping device 100 according to the present invention, in which a design of elastic device 11 as a substrate spring bar (composite of epoxy plastic, copper printed conductors, and insulating or solder resist) is now provided. Elasticity and robustness of elastic device 11 are thus advantageously increased, and multiple printed conductors may be guided over the spring structures, optionally also in multiple layers.

Figure 6:
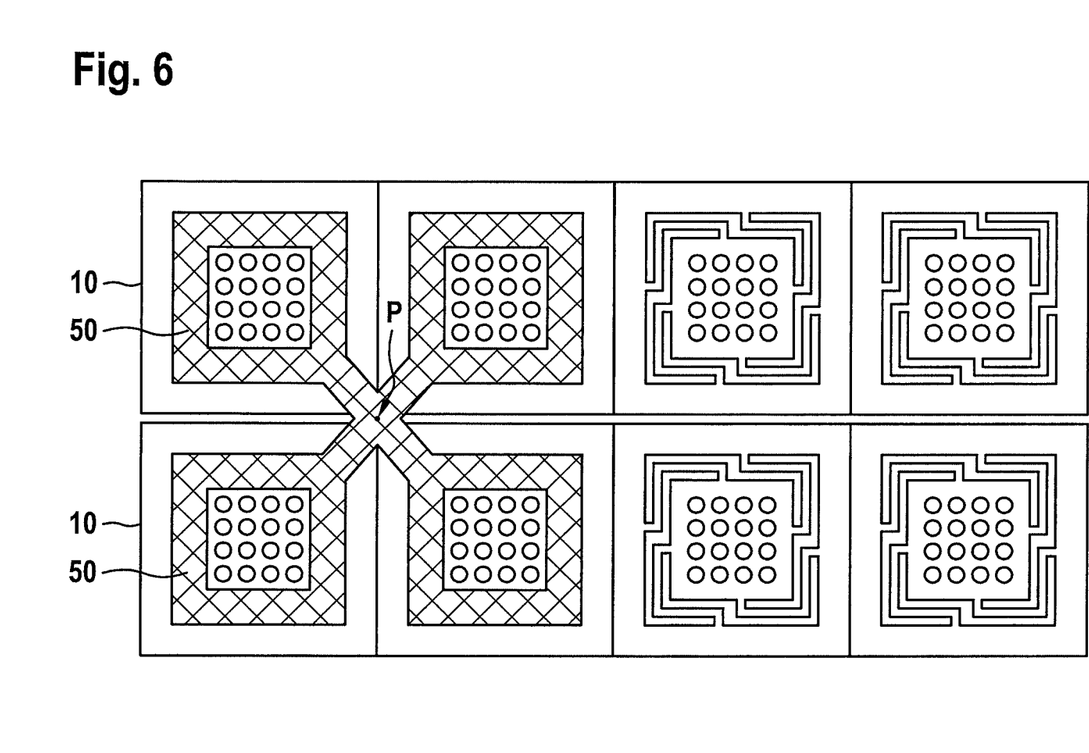
FIG. 6 shows one option for efficient extrusion of the spring structures of the first intermediate layer, using an elastic damping material.

FIG. 6 shows one option, in principle, of efficient extrusion of first intermediate layer 10, using elastic damping material 50. It is indicated that, starting from a central point P, multiple, preferably at least four, first intermediate layers 10 may be extruded at the same time using elastic damping material 50.

Figure 7:
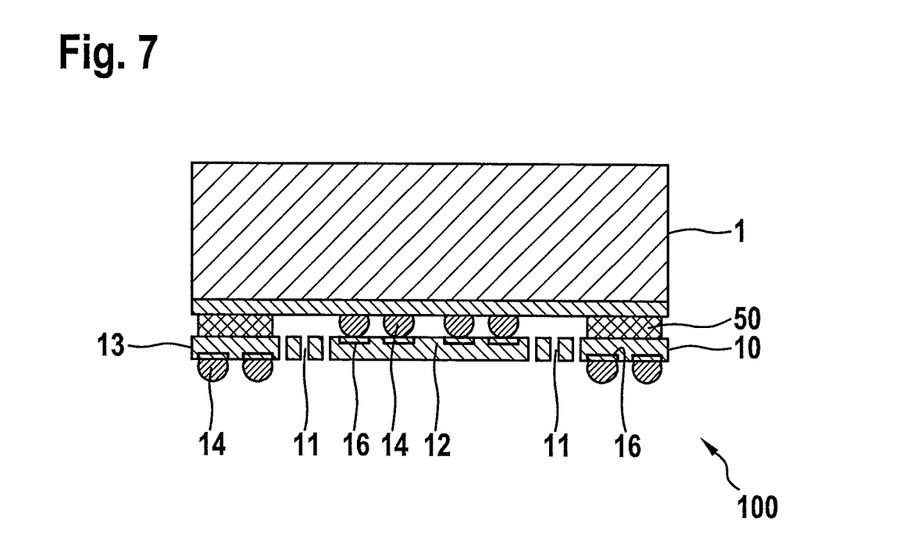
FIG. 7 shows another specific embodiment of the damping device according to the present invention.
Figure 8:
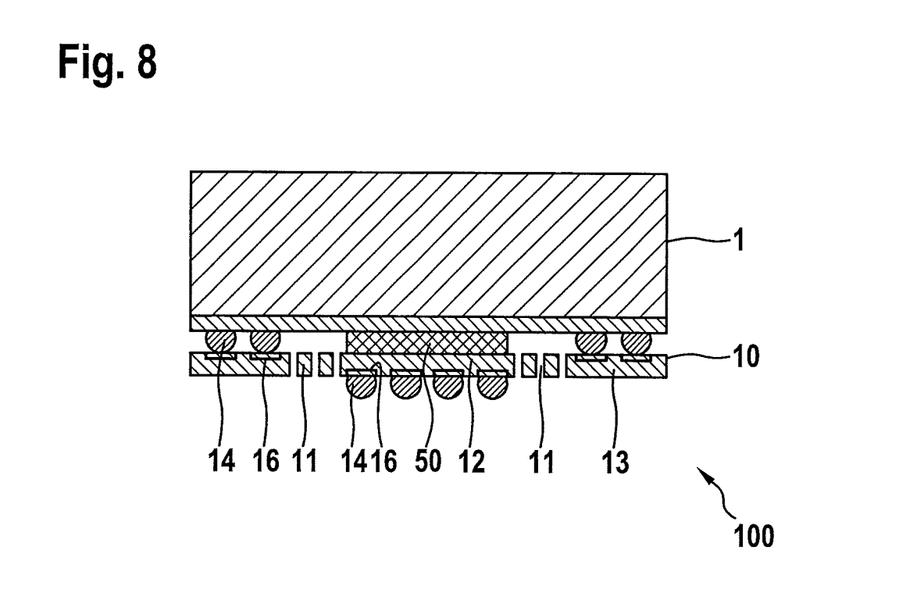
FIG. 8 shows another specific embodiment of the damping device according to the present invention.

FIG. 7 and FIG. 8 show two further specific embodiments of damping device 100 according to the present invention, the two mentioned specific embodiments generally corresponding to the specific embodiments in FIG. 1 and FIG. 2, except that now, elastic damping material 50 is inserted between first intermediate layer 10 and a printed circuit board substrate of sensor device 1. In contrast to the specific embodiments in FIG. 4 and FIG. 5, elastic damping material 50 is now subjected to shear, with bending components, during in-plane motions (lateral), and is subjected to compression during out-of-plane motions. A frequency position of the resonances may be set, among other ways, via dimensions or structurings of gel fields of elastic damping material 50. A very flexible design and bearing of excitation modes which occur are thus advantageously assisted.

Figure 9:
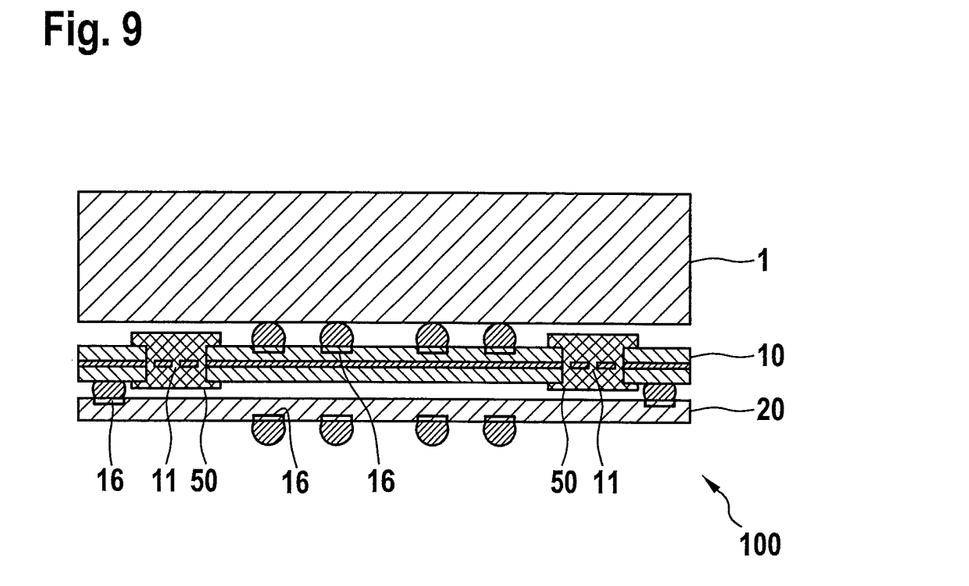
FIG. 9 shows another specific embodiment of the damping device according to the present invention.

FIG. 9 shows another specific embodiment of damping device 100 according to the present invention, a second intermediate layer 20 now being provided which outwardly maps a contacting pattern ("ball grid") of micromechanical sensor device 1, which is housed by a BGA sensor housing, beneath an overall system. Second intermediate layer 20 thus assumes solely a rewiring function, and assumes generally no oscillation-related aspects of the present invention. In this way, pin-compatible variants of a damped or undamped sensor device 1 may be advantageously connected to printed circuit board 60 in an electrically conductive manner.

Figure 10:
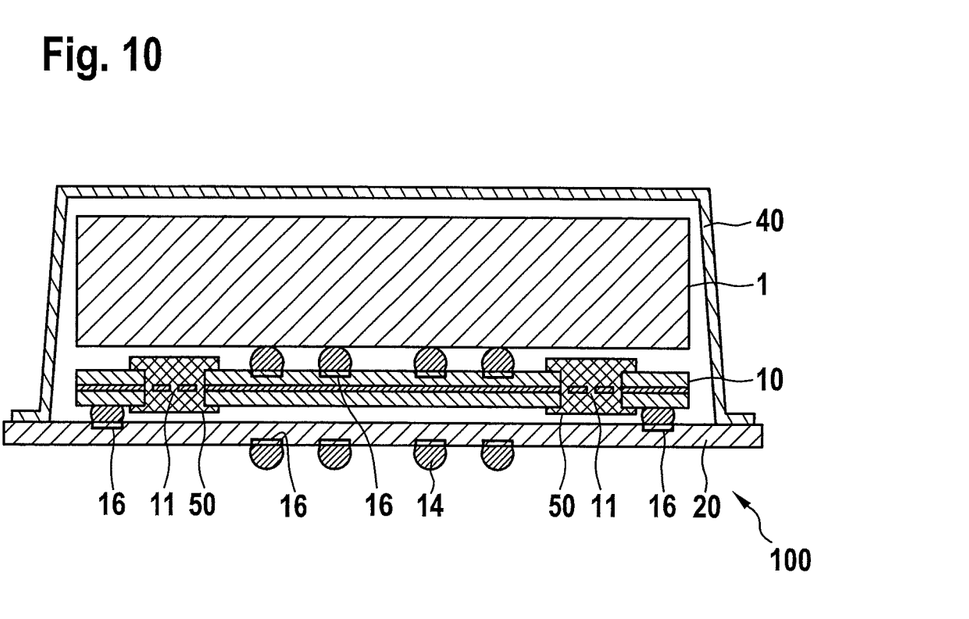
FIG. 10 shows one specific embodiment of the damping device according to the present invention which is protected with the aid of a cover device.

A refinement of damping device 100 according to the present invention, shown in FIG. 10, is characterized in that a cover device 40 is provided which protects the system composed of sensor device 1 and first intermediate layer 10 from external influences. For damping device 100 according to the present invention, this advantageously results in EMC and/or handling protection, for example for improved manual handling of damping device 100 having sensor device 1.

Figure 11:
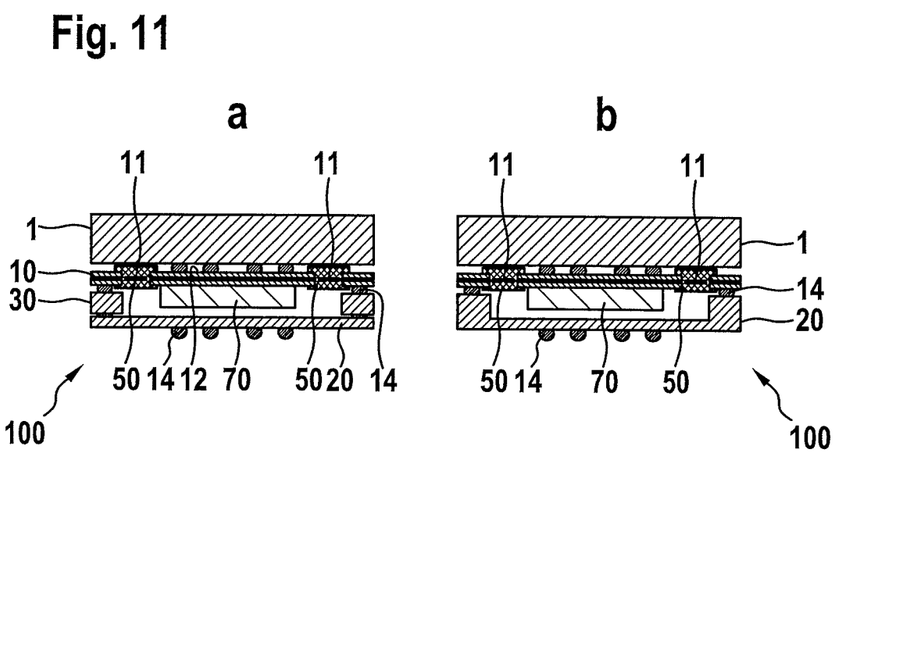
FIG. 11 shows two further specific embodiments of the damping device according to the present invention.

FIG. 11 shows two specific embodiments of damping devices 100 according to the present invention, each being balanced with the aid of a physical mass 70, a center of mass of the overall system being situated generally in the plane of first intermediate layer 10. In a variant a, physical mass 70 is situated on a bottom side of first section 12 of first intermediate layer 10. Alternatively or additionally, instead of physical mass 70 other passive electronic components, for example resistors and/or capacitors, may be installed. A third intermediate layer 30 is used for electrical contacting of first intermediate layer 10 with second intermediate layer 20.

Variants a and b differ solely in that variant b has a cavity-shaped second intermediate layer 20. With the aid of cavity-shaped second intermediate layer 20 in variant b, third intermediate layer 30 may advantageously be dispensed with. It is also possible for the two variants a and b to be designed in each case without second intermediate layer 20 (or third intermediate layer 30 of variant a), in which case a thickness of physical mass 70 must be smaller than a height of contacting elements 14 for printed circuit board 60 (not illustrated). Alternatively, physical mass 70 may also be "sunk" (not illustrated) into a cavity of first section 12 of first intermediate layer 10.

Figure 12:
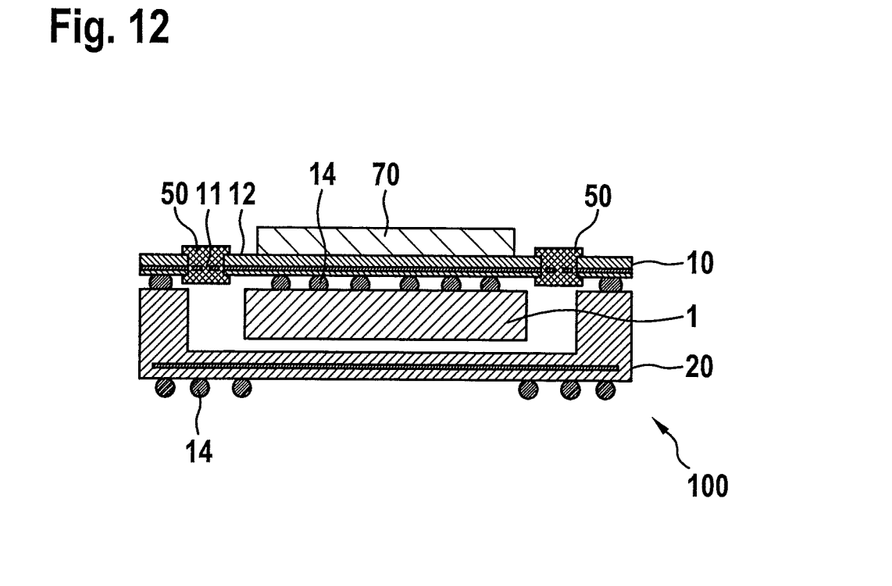
FIG. 12 shows one specific embodiment of the damping device according to the present invention, in which the housed micromechanical sensor device is protected by the first intermediate layer.

FIG. 12 shows a modification of the variants in FIG. 11; compared to the specific embodiment in FIG. 11, the arrangements of sensor device 1 and of physical mass 70 have been interchanged. As a result, sensor device 1 is situated within cavity-shaped second intermediate layer 20 in a "hanging" manner, in a manner of speaking, beneath first section 12 of first intermediate layer 10. In order to now achieve a static and dynamic balancing, physical mass 70 is situated on the top side of first section 12 of first intermediate layer 10. This results in a balanced design of the overall system for avoiding tilting modes. In accordance with this specific embodiment, a design of the overall system of damping device 100 is as symmetrical as possible relative to the center of mass. Additional second intermediate layer 20 may be used as a protective enclosure, or also for transferring a contacting pattern of sensor device 1 to a printed circuit board 60 (not illustrated), and may optionally have metal layers (made of copper or stainless steel, for example, not illustrated) for purposes of EMC shielding.

The three specific embodiments illustrated in FIGS. 11 and 12 may require very voluminous physical masses 70 under some circumstances. The reason is that the arrangements have a small torque due to their proximity to a center of gravity, and therefore require very large compensating masses.

Figure 13:
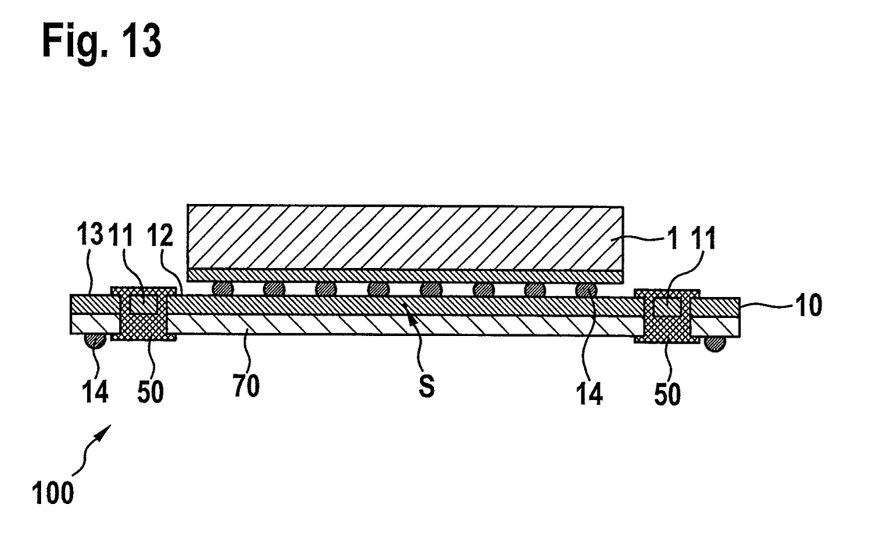
FIG. 13 shows another specific embodiment of the damping device according to the present invention.

Therefore, the specific embodiment of damping device 100 in FIG. 13 includes a flat design of physical mass 70 (in the form of a metal (copper) layer, for example) as a compensating measure, and to bring same into essentially uninterrupted flat contact with first intermediate layer 10. Introduced physical mass 70 is used to set a resonance frequency of the spring-mass system (mass as design parameter), and also to balance damping device 100 (mass distribution or moment of inertia as design parameter). In the design of this type of physical mass 70, standard processes established in printed circuit board technology may advantageously be resorted to, the mentioned flat metallic additional mass having solely a weight aspect for the present invention (no thermal aspects). Rotational axes for the dynamic balancing of the system are specified by micromechanical sensor devices 1 (drive direction or sensing direction for a yaw rate sensor, or sensing direction for an acceleration sensor). The intent is to balance the system with respect to the mentioned axes. In the balanced state, main axes of an inertia ellipsoid of the oscillatable design coincide with the sensitivity axes of sensor device 1, so that the vector of the angular momentum is parallel to the rotational axis. A center of gravity S, with respect to which the overall system is centrally balanced, is indicated in FIG. 13.

Figure 14:
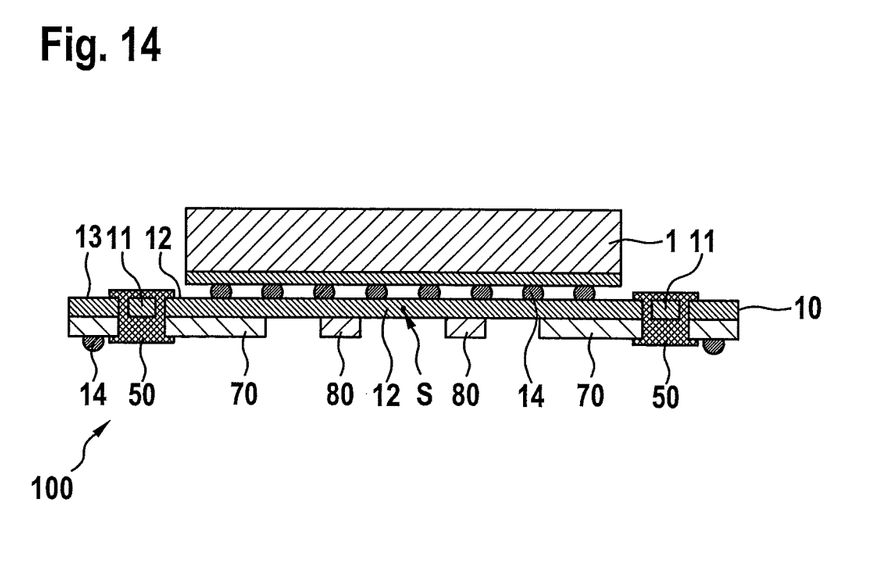
FIG. 14 shows another specific embodiment of the damping device according to the present invention.

FIG. 14 shows a modification of the specific embodiment in FIG. 13. An interrupted additional physical mass 70 is now mounted on the bottom side of first intermediate layer 10, a central area of the overall system being cut out. This results in a mass reduction which, however, advantageously has only a slight effect on the moment of inertia of the overall system. The free space on the substrate underside of first intermediate layer 10 may advantageously and optionally be used for installing further circuit components 80 (resistors, capacitors, for example). A center of gravity S, with respect to which the overall system is centrally balanced, is indicated in FIG. 14.

Figure 15:
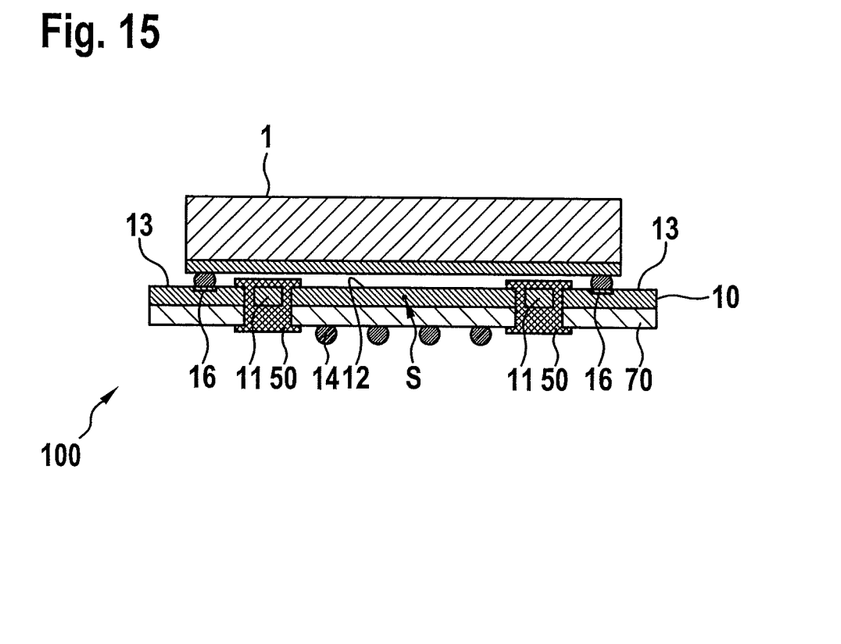
FIG. 15 shows another specific embodiment of the damping device according to the present invention.
Figure 16:
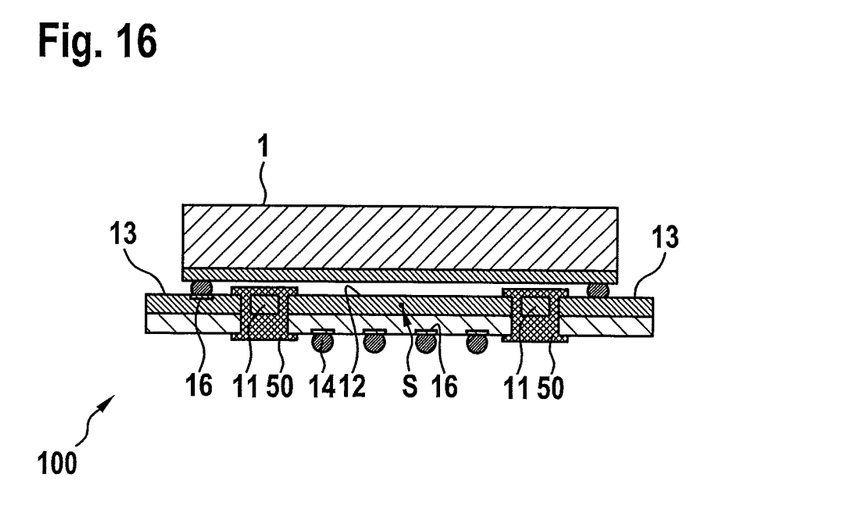
FIG. 16 shows another specific embodiment of the damping device according to the present invention.

FIGS. 15 and 16 show two further specific embodiments of damping device 100 according to the present invention, with a physical mass 70 shifted into first intermediate layer 10. A reduced lateral dimension of the overall system is advantageously possible in these specific embodiments. This is due to the fact that the effective mechanical mass is now present generally in second, outer section 13 of first intermediate layer 10. In these two specific embodiments, contacting of connections of sensor device 1 takes place on a top side of second section 13 of first intermediate layer 10. The connections are through-contacted on a bottom side of physical mass 70 via contact surfaces 16 of first intermediate layer 10, the variant in FIG. 16 having the specific feature that beneath first section 12 of first intermediate layer 10, physical mass 70 is provided not in the form of a metal, but instead in the form of a conventional printed circuit board substrate. Through-contacting of the connections may thus be significantly simplified compared to the specific embodiment in FIG. 15. In addition, the weight reduction achieved in this way contributes to simplified and improved overhead soldering of the overall system.

Figure 17:
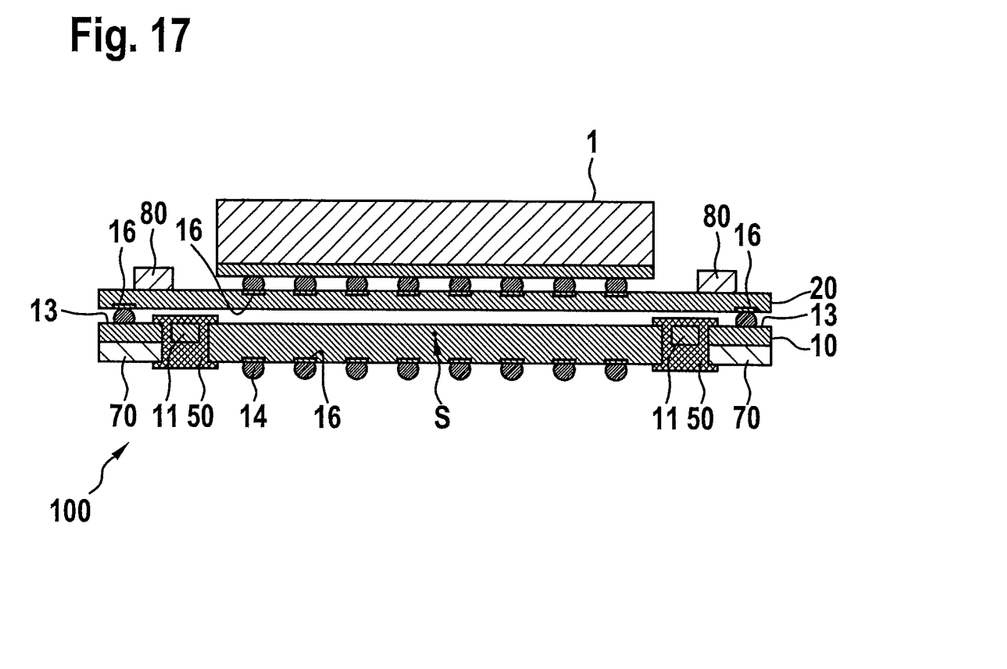
FIG. 17 shows another specific embodiment of the damping device according to the present invention.

FIG. 17 shows one specific embodiment of damping device 100 which is preferably to be provided when a lateral dimension of sensor device 1 is small compared to first intermediate layer 10. In this case, a second intermediate layer 20 is situated between sensor device 1 and first intermediate layer 10 in an electrically conductive manner, second intermediate layer 20 being used solely for electrical through-contacting of electrical contacts of sensor device 1 to first intermediate layer 10. Further circuit components 80 may advantageously be situated on a free space on a top side of second intermediate layer 20. A physical mass 70, which may optionally be made of metal or designed as substrate material, is situated beneath a second section 13 of first intermediate layer 10. A particular advantage of the mentioned specific embodiment is the contacting compatibility of the sensor module with damping device 100, as the result of which sensor device 1 may be contacted with printed circuit board 60 (not illustrated) with or without damping device 100, depending on the application.

Figure 18:
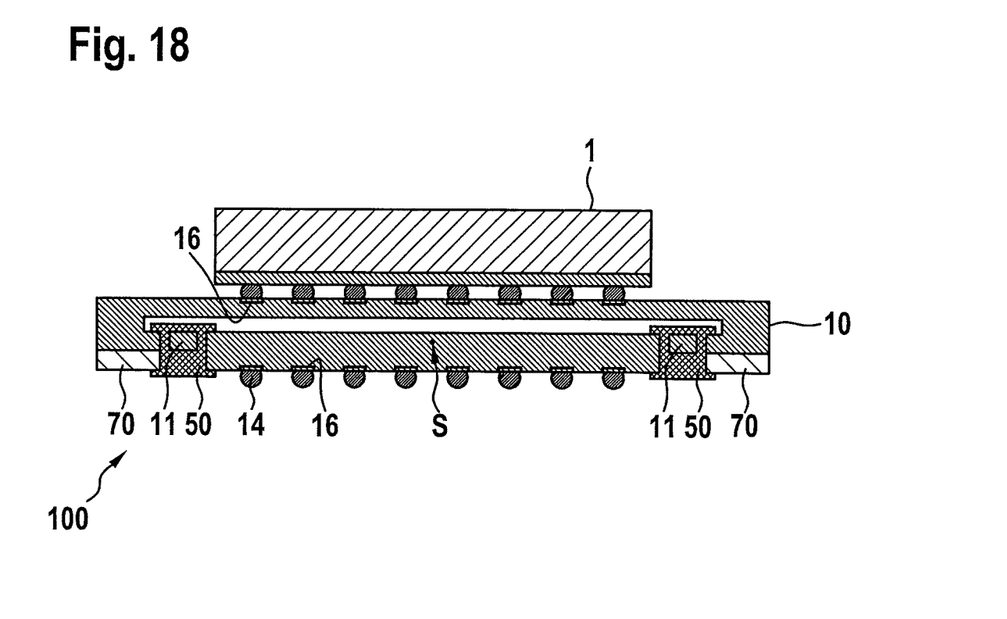
FIG. 18 shows another specific embodiment of the damping device according to the present invention.

FIG. 18 shows another specific embodiment of damping device 100 according to the present invention. First intermediate layer 10 has a cavity, as the result of which connections between electrical contact surfaces 16 of first intermediate layer 10 are possible using conventional printed circuit board technology. For example, this may be achieved by lamination and subsequent insertion of through contacts, so that, compared to the specific embodiment in FIG. 17, an additional soldering step is dispensed with. Due to the simpler production, the specific embodiment in FIG. 18 is appropriate in particular in cases in which elastic damping material 50 may be dispensed with.

All of the above-mentioned damping devices 100 damp particularly effectively against disturbances, preferably approximately in a range above approximately 5 kHz, since this is a frequency range in which sensor devices 1 are particularly sensitive to disturbances due to an excitation in this frequency range.

Of course, types of housings not mentioned above may also be used for micromechanical sensor device 1 which is to be damped with the aid of damping device 100 according to the present invention.

In summary, the present invention proposes an improved damping device for a housed micromechanical sensor, via which it is possible to minimize harmful vibration and oscillation effects on the sensor device. As described above, the principle according to the present invention may be implemented by numerous modifications and variations, it being understood as a matter of course that all described specific embodiments are regarded strictly as examples, and that modifications of specific embodiments are also implementable even if they have not been described, or have not been described with all features, above.

Features of the present invention may be modified and combined with one another without departing from the core of the present invention.

What is claimed is:

1. A damping device for a micromechanical sensor device, comprising:
   at least one first intermediate layer having at least two sections, a second one of the sections being situated around a first one of the sections, a lateral distance being provided between the first section and the second section, and an elastic device situated between the first section and the second section as an integral part of the first intermediate layer,
wherein the first intermediate layer includes a printed circuit board material, and
wherein the first intermediate layer has contacting elements that are electrically conductive, and wherein with the aid of the contacting elements, electrical contact surfaces on a top side of the first intermediate layer are connected via the elastic device to electrical contact surfaces on the bottom side of the first intermediate layer in an electrically conductive manner; and
a second intermediate layer having a printed circuit board material, the second intermediate layer being connected to the first intermediate layer in an electrically conductive manner, the second intermediate layer mapping an electrical contacting pattern of the top side of the first intermediate layer onto a bottom side of the second intermediate layer.

2. The damping device as recited in claim 1, wherein the contacting elements of the first intermediate layer are situated one of on a bottom side of the second section or on a bottom side of the first section.

3. The damping device as recited in claim 1, wherein the elastic device includes at least three uniformly arranged elastic elements between the first section and the second section.

4. The damping device as recited in claim 1, wherein an area around the elastic device has an elastic damping material, at least in places.

5. The damping device as recited in claim 4, wherein the damping material includes at least one material from the following group: silicone elastomer, silicone gel, gel containing fillers, and foam-like material.

6. The damping device as recited in claim 4, wherein the elastic damping material one of: i) is situated, at least in part, on a top side of the second section of the first intermediate layer, or ii) is situated, at least in part, on a top side of the first section of the first intermediate layer.

7. The damping device as recited in claim 1, further comprising:
a cover device covering the damping device together with the micromechanical sensor device.

8. The damping device as recited in claim 1, wherein the micromechanical sensor device is attachable beneath the first section of the first intermediate layer, the second intermediate layer connecting electrical contact surfaces of the first section to electrical contact surfaces on a bottom side of the second intermediate layer in an electrically conductive manner, a physical mass being provided on a top side of the first section for balancing the damping device together with the micromechanical sensor device.

9. A damping device for a micromechanical sensor device, comprising:
at least one first intermediate layer having at least two sections, a second one of the sections being situated around a first one of the sections, a lateral distance being provided between the first section and the second section, and an elastic device situated between the first section and the second section as an integral part of the first intermediate layer,
wherein the first intermediate layer includes a printed circuit board material,
wherein the first intermediate layer has contacting elements that are electrically conductive, and wherein with the aid of the contacting elements, electrical contact surfaces on a top side of the first intermediate layer are connected via the elastic device to electrical contact surfaces on the bottom side of the first intermediate layer in an electrically conductive manner, and
wherein a physical mass is situated on a bottom side of the first section, the physical mass being designed in such a way that a center of gravity of the damping device together with the sensor device is situated centrally in the first intermediate layer.

10. The damping device as recited in claim 9, wherein the physical mass is a metal layer, the metal layer being connected to the first intermediate layer with secure contact.

11. The damping device as recited in claim 10, wherein a center of gravity of the damping device together with the sensor device is centrally situated, moments of inertia of the sensor device, of the first intermediate layer, and of the physical mass cancelling each other out.

12. The damping device as recited in claim 9, wherein the physical mass is situated, at least partially, beneath the first intermediate layer.

13. The damping device as recited in claim 12, wherein the physical mass is situated at least predominantly beneath the second section.

14. The damping device as recited in claim 9, wherein a further large-mass printed circuit board layer is situated one of beneath the first section or beneath the first section and the second section of the first intermediate layer, a bottom side of the first intermediate layer being electrically contactable with the printed circuit board.

15. The damping device as recited in claim 14, wherein the damping device includes a second intermediate layer which is connected to a top side of the second section of the first intermediate layer in an electrically conductive manner, the second intermediate layer connecting electrical contact surfaces to contact surfaces on a bottom side of the first section of the first intermediate layer in an electrically conductive manner.

16. The damping device as recited in claim 15, wherein a printed circuit board material of the first intermediate layer has a cavity, electrical contact surfaces on a top side of the first intermediate layer being connected to contact surfaces on a bottom side of the first section of the first intermediate layer.

* * * * *